(12) United States Patent
Idgunji et al.

(10) Patent No.: US 7,737,720 B2
(45) Date of Patent: Jun. 15, 2010

(54) VIRTUAL POWER RAIL MODULATION WITHIN AN INTEGRATED CIRCUIT

(75) Inventors: Sachin Satish Idgunji, San Jose, CA (US); David Walter Flynn, Cambridge (GB); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 499 days.

(21) Appl. No.: 11/797,497

(22) Filed: May 3, 2007

(65) Prior Publication Data

US 2008/0272652 A1 Nov. 6, 2008

(51) Int. Cl.
*H03K 19/003* (2006.01)

(52) U.S. Cl. .......................... 326/33; 326/34; 326/102; 327/547

(58) Field of Classification Search ................... 326/31, 326/33–34, 101, 102; 327/530, 544, 547
See application file for complete search history.

(56) References Cited

U.S. PATENT DOCUMENTS

| | | | |
|---|---|---|---|
| 5,300,823 A | 4/1994 | Ihara | |
| 5,726,946 A | 3/1998 | Yamagata et al. | |
| 6,433,584 B1 | 8/2002 | Hatae | |
| 6,977,519 B2 | 12/2005 | Bhavnagarwala et al. | |
| 7,005,888 B1 * | 2/2006 | Baxter | 326/41 |
| 7,145,383 B2 * | 12/2006 | Mizuno et al. | 327/546 |
| 7,355,455 B2 * | 4/2008 | Hidaka | 326/121 |
| 7,504,854 B1 * | 3/2009 | Look et al. | 326/38 |
| 7,532,036 B2 * | 5/2009 | Fujikawa et al. | 326/98 |
| 2007/0103195 A1 | 5/2007 | Duk-Sohn et al. | |

FOREIGN PATENT DOCUMENTS

WO  WO 2005/114667  12/2005
WO  WO 2007/072402  6/2007

* cited by examiner

*Primary Examiner*—James Cho
(74) *Attorney, Agent, or Firm*—Nixon & Vanderhye P.C.

(57) ABSTRACT

An integrated circuit is provided with logic blocks which draw their power from virtual supply rails. These virtual supply rails are connected by switch blocks to main supply rails. The switch blocks are subject to modulation to maintain the virtual supply rails at an intermediate voltage level such that a reduced voltage difference is applied across the logic block. This intermediate voltage level is used in a state retention mode in which the clock signal clk to the logic block is stopped and state signal values are maintained therein using this reduced virtual power rail derived voltage difference. When it is desired to resume processing then the full virtual rail voltages are restored by rendering the switch blocks fully conductive and then the clock is restarted. The switch blocks which are modulated by controllers which use feedback control based upon the sensed virtual rail voltages ($VV_{dd}$ and $V_{gnd}$) while drawing their own power from the normal supply rails ($V_{dd}$ and $_{gnd}$).

46 Claims, 4 Drawing Sheets

VIRTUAL POWER RAIL MODULATION WITHIN AN INTEGRATED CIRCUIT

BACKGROUND OF THE INVENTION

1. Field of the Invention

This invention relates to the field of integrated circuits. More particularly, this invention relates to integrated circuits having virtual power rails connected to a main power rail via a switch block.

2. Description of the Prior Art

It is known to provide integrated circuits including power rails connected via switch blocks to virtual power rails. The logic blocks within the integrated circuit then draw their power from the virtual power rails. The switch blocks, which are typically high threshold voltage header and footer transistors, can be used to isolate the virtual power rail from the main power rail and accordingly isolate the logic blocks from the power supply. This is useful in reducing power consumption of the integrated circuit, e.g. by reducing the static leakage current therethrough.

While the above approach is successful, it suffers from the problem that state (e.g. data values, instruction values, configuration etc) within the logic blocks is lost when they are isolated from the power supply. Furthermore, it can take a disadvantageously long period of time to restore this state and recommence processing using the logic blocks when it is desired to switch out of the low power mode. One way of at least partially addressing these problems is to provide balloon latches within the logic blocks to store relevant state signal values using circuits which do remain continuously powered (and are typically formed with high voltage threshold transistors having low leakage currents) so that the signal state values can be restored into the logic block when required and then processing recommenced. A problem with this approach is the overhead associated with the circuit area of the balloon latches, the control thereof and the time taken to restore the signal values from the balloon latches into the logic blocks.

SUMMARY OF THE INVENTION

Viewed from one aspect the present invention provides an integrated circuit comprising:

a switch block coupled to a virtual power rail to couple said virtual power rail to a power supply having a source voltage level;

a switch controller coupled to said switch block to control conduction through said switch block and thereby selectively to connect said virtual power rail to said power source having said source voltage level; and logic circuitry coupled to said virtual power rail to draw power therefrom; wherein said switch controller modulates conduction through said switch block to maintain said virtual power rail at an intermediate voltage level.

The present technique recognizes that it is possible to use the virtual power rail architecture within integrated circuits in a more sophisticated way than simply connecting the virtual power rail to the power supply (e.g. via a power rail or a ground rail) during normal operation and isolating the virtual power rail from the power supply during low power operation. More particularly, the present technique recognizes that by modulating (switching on and off repeatedly) the connection between the power supply, and the virtual power rail the virtual power rail can be controlled to adopt voltage levels that can be used to reduce power consumption within the integrated circuit.

While the control of the connection between the power supply and the virtual power rail can be with fixed modulation characteristics determined to correspond to acceptable intermediate voltage levels, in preferred embodiments the modulation is adaptively controlled using feedback, such as by adjusting the duty ratio of the modulation in order to maintain the intermediate voltage within a predetermined range of voltages. Such adaptive control is useful in allowing the present techniques to be reliably used across a range of integrated circuits and within integrated circuits that can be subject to considerable process, voltage and temperature variations where fixed control would require large margins significantly reducing the advantages to be gained.

While the present technique could be used to provide intermediate voltage levels for a variety of different purposes, e.g. for providing dynamic voltage scaling operation during processing by the logic blocks so as to match the supply voltage for the logic blocks to a desired clock frequency, the present technique may also be used to good effect for data retention when the logic blocks are static. In accordance with this technique, it is recognized that the logic blocks can retain state signal values when static using lower voltage difference across the logic blocks than would be acceptable when the logic blocks were active in performing their intended processing activity. This is exploited by using the switch controller to modulate conduction through the switch block to maintain the virtual power rail voltage at a level sufficient to retain the state signal values, but below the normal operational voltage(s) in a manner that reduces power consumption for the logic block compared to its power consumption if static when using the normal operating voltage. Thus, static power consumption (leakage) can be reduced without the need to employ additional balloon latches and the transition back to active processing can be made by a relatively rapid increase in the voltage of the virtual power rail back to a level capable of supporting active processing followed by restarting the clock.

It will be appreciated that the switch block which isolates the main rail from the virtual rail could be provided in the header between the power supply rails or in the footer between the ground rails. It may also be provided in both of these locations if desired and appropriate to the particular fabrication technology.

The switch block could take a variety of different forms, and in its simplest form could be a single strong transistor used to connect the power rail to the virtual power rail during active processing. However, in preferred embodiments the switch block may be formed of a strong transistor and a weak transistor with the weak transistor being modulated in accordance with the present technique while the strong transistor is switched off during such modulation. Providing a weak transistor in this way allows the manner in which the modulation of the transistor alters the virtual power rail voltage to be tuned in a manner which reduces the power consumed by the modulation process itself. A strong transistor capable of supporting the virtual rail voltage at an operational level during active processing may be ill suited to a finer and more delicate control appropriate to modulation, particularly during retention mode operations when the charge leakage is relatively low.

The feedback control can be performed in a variety of different ways, such as by use of an analog feedback circuit. However, analog feedback control can be difficult to achieve accurately from a practical point of view within an integrated circuit which is principally arranged for digital signal processing and accordingly preferred embodiments may use feedback control serving to maintain the intermediate voltage with a hysteresis characteristic resulting in a period variation in the intermediate voltage, such as by switching the switch block to a conductive state when the voltage differences across the logic block is too low and switching the switch block to a non-conducting state when the voltage across the logic block is too high, with this trigger levels being spaced apart.

While it would be possible to define the end points of a predetermined range within which the voltage across the logic block should be maintained using analog signals input to the integrated circuit, or generated at the central point within the integrated circuit, the distribution of such analog signals around an integrated circuit is problematic from a practical point of view as is controlling their accuracy. Accordingly, in preferred embodiments, the end points of the predetermined range are defined by signals generated within the switch controller itself.

It will be appreciated by those in this technical field that is normal for an integrated circuit to be formed with a large number of header or footer blocks for coupling the power rails to the virtual power rails. The modulation control of the present technique could be applied to all of these switch blocks. However, it may be sufficient in some embodiments to provide the modulation techniques herein to a subset of these switch blocks. This is because the modulation of one switch block can, during a low-power retention mode, be sufficient to provide a retention voltage to multiple logic blocks which would require their individual switch blocks during an active mode. Additionally, it may be that only certain portions or domains within the integrated circuit are subject to the modulation techniques described herein.

When multiple switch blocks are performing modulation in accordance with the present techniques to provide intermediate virtual power rail voltages, it is advantageous if these are individually self-regulating. This avoids complication due to the need to distribute centralized control to the different switch blocks, as well as making the switch blocks more able to adapt to the requirements of their local logic blocks and local circuit characteristics/variations.

The present technique can be applied to a wide variety of different forms of integrated circuit, but is well suited to integrated circuits using CMOS transistors, and particularly MTCMOS transistors and silicon on insulator devices.

The logic blocks of the integrated circuit discussed above can take a wide variety of different forms but the present technique is particularly well suited to implementations where the logic blocks are clocked and where, when the clock signal is static, the logic blocks do not perform processing and instead hold state signal values such that the processing can be restarted by restarting the clock signal.

While the present techniques can be used for a variety of purposes, they are well suited to situations in which it is desired to reduce the power consumption of an integrated circuit when the processing requirements placed upon that integrated circuit are reduced, i.e. to place the integrated circuit into a low performance or standby mode in which power consumption is reduced.

Viewed from another aspect the present invention provides an integrated circuit comprising:

switch means coupled to a virtual power rail for coupling said virtual power rail to a power supply having a source voltage level;

switch controller means coupled to said switch block for controlling conduction through said switch means and thereby selectively to connect said virtual power rail to said power source having said source voltage level; and logic means coupled to said second power rail to draw power therefrom; wherein said switch controller means modulates conduction through said switch means to maintain said second power rail at an intermediate voltage level.

Viewed from a further aspect the present invention provides a method of reducing power consumption of an integrated circuit having a power supply switchably connected to a virtual power rail and with a logic block drawing power from said virtual power rail, said method comprising:

modulating said connection between said power supply and said virtual power rail so as to maintain a voltage difference across said logic block at a level less than when said virtual power rail is continuously connected to said power rail.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
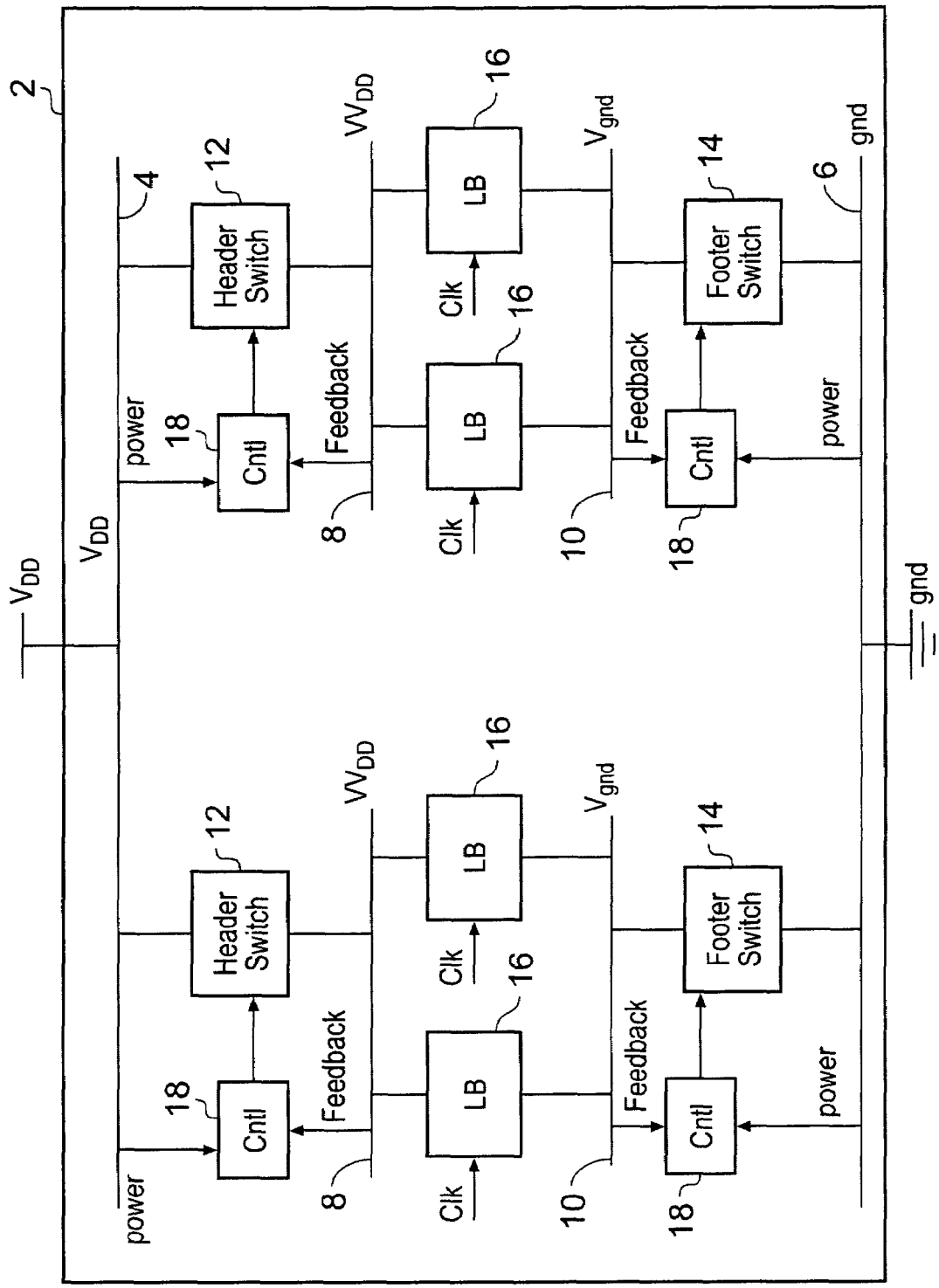
FIG. 1 schematically illustrates an integrated circuit employing main power rails, virtual power rails, header switches and footer switches together with modulation of the connections between the main power rails and the virtual power rails.

FIG. 1 illustrates an integrated circuit 2 including a main supply rail 4, a main ground rail 6, a virtual supply rail 8 and a virtual ground rail 10. Header switches 12 selectively connect the main supply rail 4 to the virtual supply rail 8. Similarly, footer switches 14 selectively connect the main ground rail 6 to the virtual ground rail 10. Logic blocks 16 draw their power supply from the virtual supply rail 8 and the virtual ground rail 10. The logic blocks 16 are clocked with a clock signal clk to perform data processing operations.

The integrated circuit 2 can be formed using different fabrication technologies but the present technique is well suited to systems in which the integrated circuit is formed of CMOS transistors, and more particular MTCMOS transistors. It will be appreciated that the integrated circuit 2 will typically be formed of a large number of functional elements and can take a variety of different forms, such as a microprocessor, a SoC, a memory or other forms of integrated circuit.

Also illustrated in FIG. 1 are switch controllers 18, which are coupled to their respective switches and control these to be either conductive or non-conductive. The switch controllers 18 are also coupled to the respective virtual power rails 8, 10 and are responsive to the voltages thereon to modulate the connection provided by their associated header and footer switches 12, 14 between the main supply rail 4 and the virtual supply rail 8 and between the main ground rail 6 and the virtual ground rail 10. This modulation maintains the virtual rail voltages at intermediate levels compared to the situation in which the switches are either permanently conductive or permanently non-conductive. This modulation can in some embodiments be used to provide a form of dynamic voltage scaling in which the power supply voltage given to the logic blocks 16 is set to an intermediate level necessary to support clocking of that logic block 16 at the currently active clock frequency. Generally speaking, the lower the voltage difference across the logic block 16, then the lower the power consumption therein. This is also true when the logic block 16 is static and the power consumption is due to static leakage currents.

The present technique recognizes that when the logic blocks 16 are not clocked, they can be used to hold state signal values without recourse to balloon latches providing a minimum retention voltage is maintained across the logic block 16. This minimum retention voltage will be less than the voltage required for active processing within that logic block 16. Thus, power consumption can be reduced by lowering the voltage difference across the logic block 16 compared with that used when the logic block 16 is active, and yet the state signal values can be maintained as held therein and ready for processing to be restarted. Processing can be restarted by restoring the voltage difference across the logic block 16 to the operational level and then restarting the clock signal. This can be relatively rapid and thus support a rapid switching between a low power retention state and an operational state.

Figure 2:
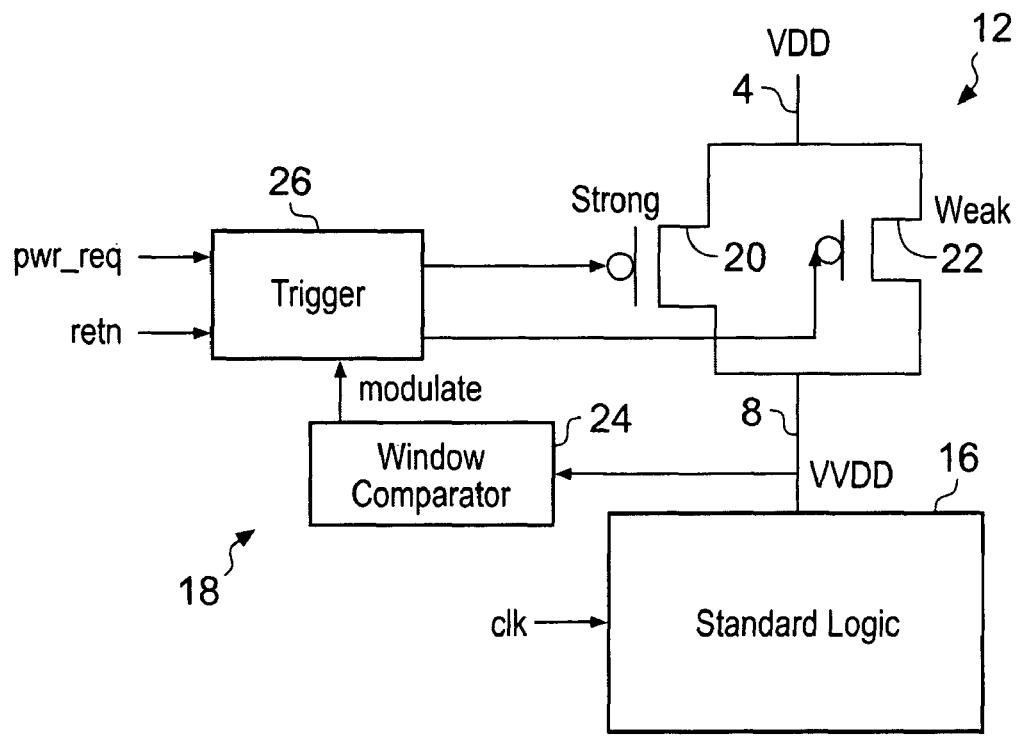
FIG. 2 is a circuit block diagram schematically illustrating one example embodiment of a header switch and switch controller for modulating the connection between a main supply rail and a virtual supply rail.

FIG. 2 illustrates a first example embodiment in which a header switch 12 is subject to modulation control by a controller 18. The header switch 12 is formed of a strong transistor 20, which has a high conductance, and a weak transistor 22, which has a low conductance. When the logic block 16 is in its active state, the strong transistor 20 is switched on to provide a low impedance path between the main supply rail 4 and the virtual supply rail 8 such that the power consumption requirements of the active logic block 16 can be satisfied. When the logic block 16 is to be placed in to its retention mode in which it statically holds state signal values, the clock signal clk thereto is stopped and the controller 18 used to modulate the weak transistor 22 between conductive and non-conductive states. The strong transistor 20 is switched off during this modulation (pulsing) operation. A window comparator 24 is used to determine when the voltage on the virtual supply rail 8 falls below a minimum level or rises above a maximum level. When the virtual supply rail voltage falls below the minimum level, then the weak transistor is switched on. The weak transistor 22 remains switched on until the virtual supply voltage reaches a maximum level at which point the weak transistor 22 is switched off. The leakage current associated with the logic block 16 then gradually discharges the stored charge on the virtual supply rail 8 until the virtual supply rail voltage again falls below the minimum value. The weak transistor 22 is then switched on again to restore the virtual supply rail voltage. In this way, the connection between the main supply rail 4 and the virtual supply rail 8 is modulated on and off via the weak transistor 22 acting under control of the window comparator 24 and the trigger circuit 26. The signal levels defining the lower limit and upper limit of the virtual supply rail voltages are internally generated within the window comparator 24 (such as by suitable voltage divider network).

Figure 3:
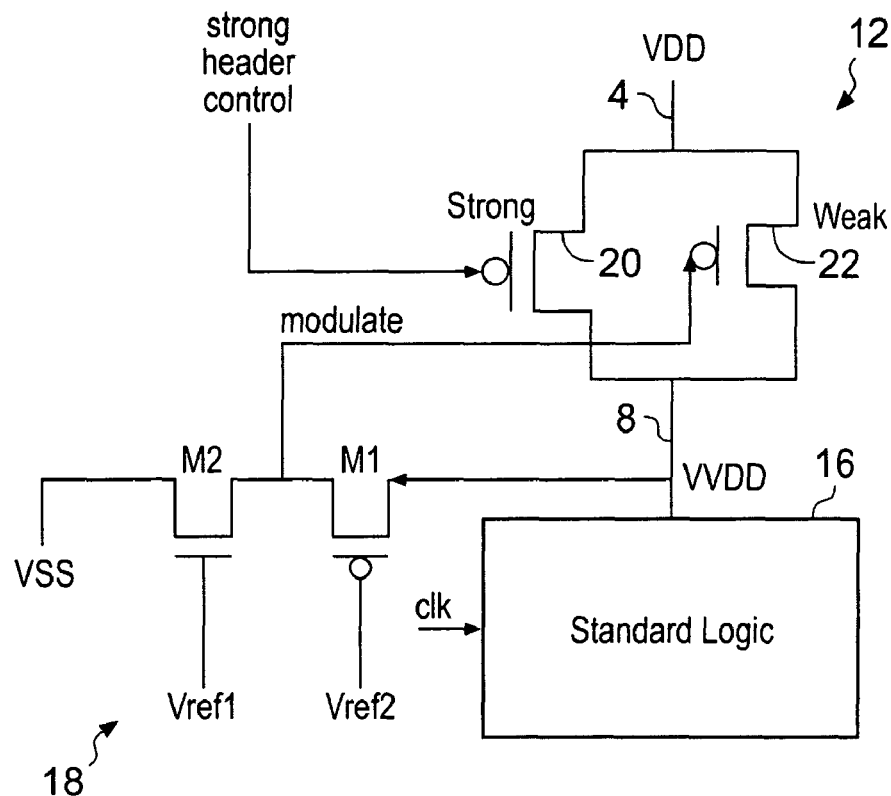
FIG. 3 is a block circuit diagram schematically illustrating a second example embodiment as a variant to that shown in FIG. 2.

FIG. 3 illustrates an alternative embodiment. In this embodiment the switch controller 18 is provided by the two transistors M1 and M2 illustrated. These have their gates supplied with the range defining voltages Vref1 and Vref2. The transistors M1 and M2 provide an analog feedback control of the virtual supply rail voltage to maintain this at an intermediate level sufficient for state signal retention within the logic block 16.

It will be seen in both FIG. 2 and FIG. 3 that the switch controller 18 provides feedback control of the virtual supply rail voltage. Thus, the switch block 16 and its associated switch controller 18 are self-regulating. It will be appreciated that an integrated circuit 2 will typically contain many instances of switch blocks 12, 14, as well as associated controllers 18. Not all of these need use the modulation techniques described herein. It may be that only certain portions of the integrated circuit 2 are appropriate to place into a low power data retention mode, or alternatively it may be that in the low power data retention mode one header switch 12 and/or footer switch 14 can service multiple logic blocks 16 whereas in the active mode individual header and footer switches 12, 14 are necessary due to the higher power requirements.

Figure 4:
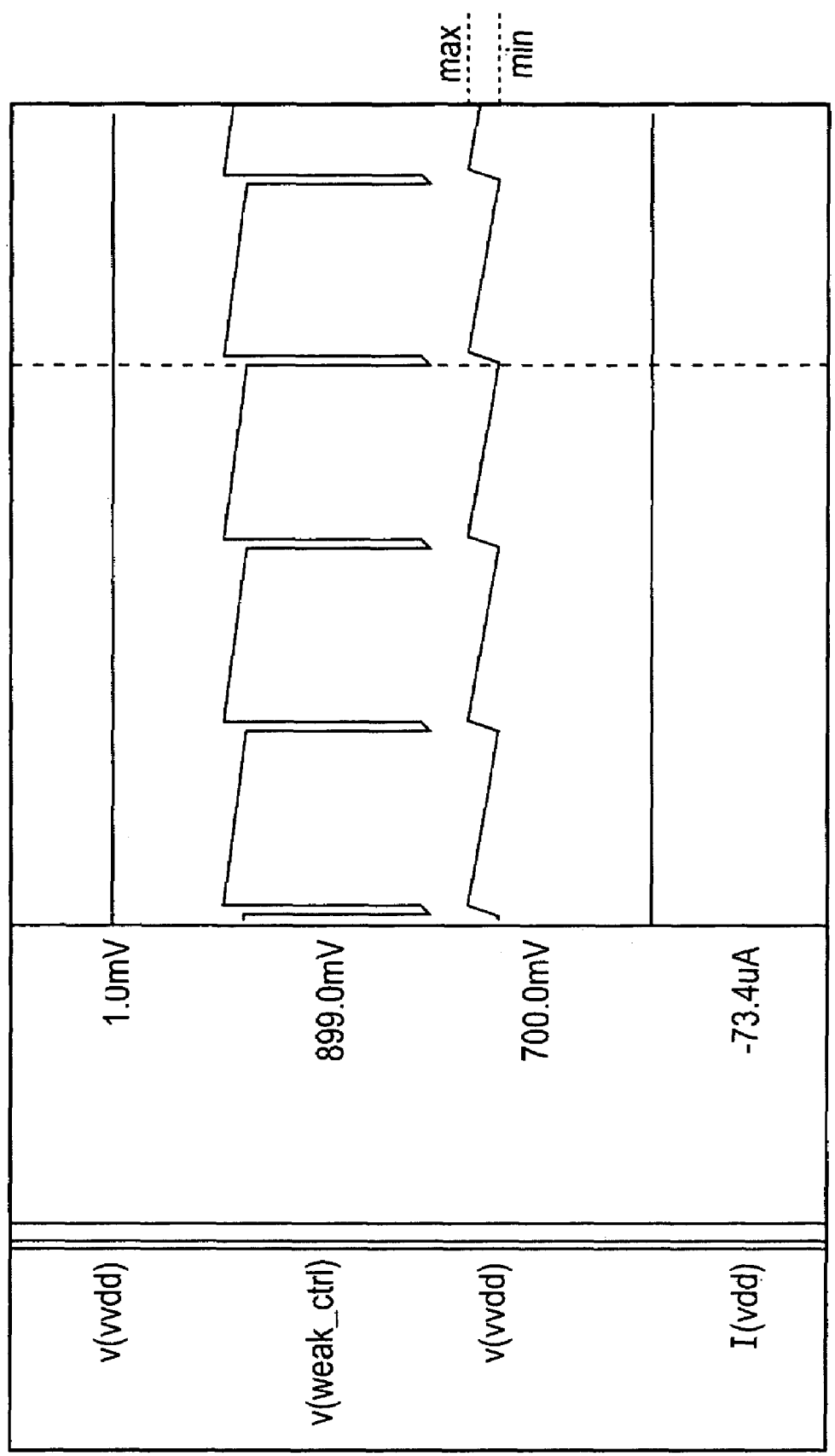
FIG. 4 is a signal diagram illustrating the variation in voltage levels with time in the example embodiment of FIG. 2.

FIG. 4 is a flow diagram schematically illustrating the periodic variation in signal levels associated with the operation of the example embodiment of FIG. 2. The signal v(weak_ctrl) is the signal which controls the switching on and the switching off the weak transistor 22. The weak transistor 22 is switched on (i.e. conductive) when this signal is low. It will be seen that the weak transistor 22 is modulated with a relatively low on duty cycle corresponding to the short periods during which the gate voltage of the weak transistor 22 is drawn low to switch the weak transistor 22 into the conductive state. The signal vvdd (the virtual supply rail voltage) is shown as having a value a little above 700 nv and with a periodic variation. This virtual supply rail voltage gradually decays due to leakage currents through the logic blocks 16 when the weak transistor 22 is switched off. When the weak transistor 22 is switched on, the virtual supply rail voltage is rapidly restored up to its predetermined maximum level. The virtual supply rail voltage thus varies between the minimum and maximum levels illustrated and is maintained in this range. This range of virtual supply rail voltages is above the minimum retention voltage, which is a characteristic of the logic block 16 and corresponds to the minimum voltage at which the logic block 16 will maintain state signal values when unclocked.

Figure 5:
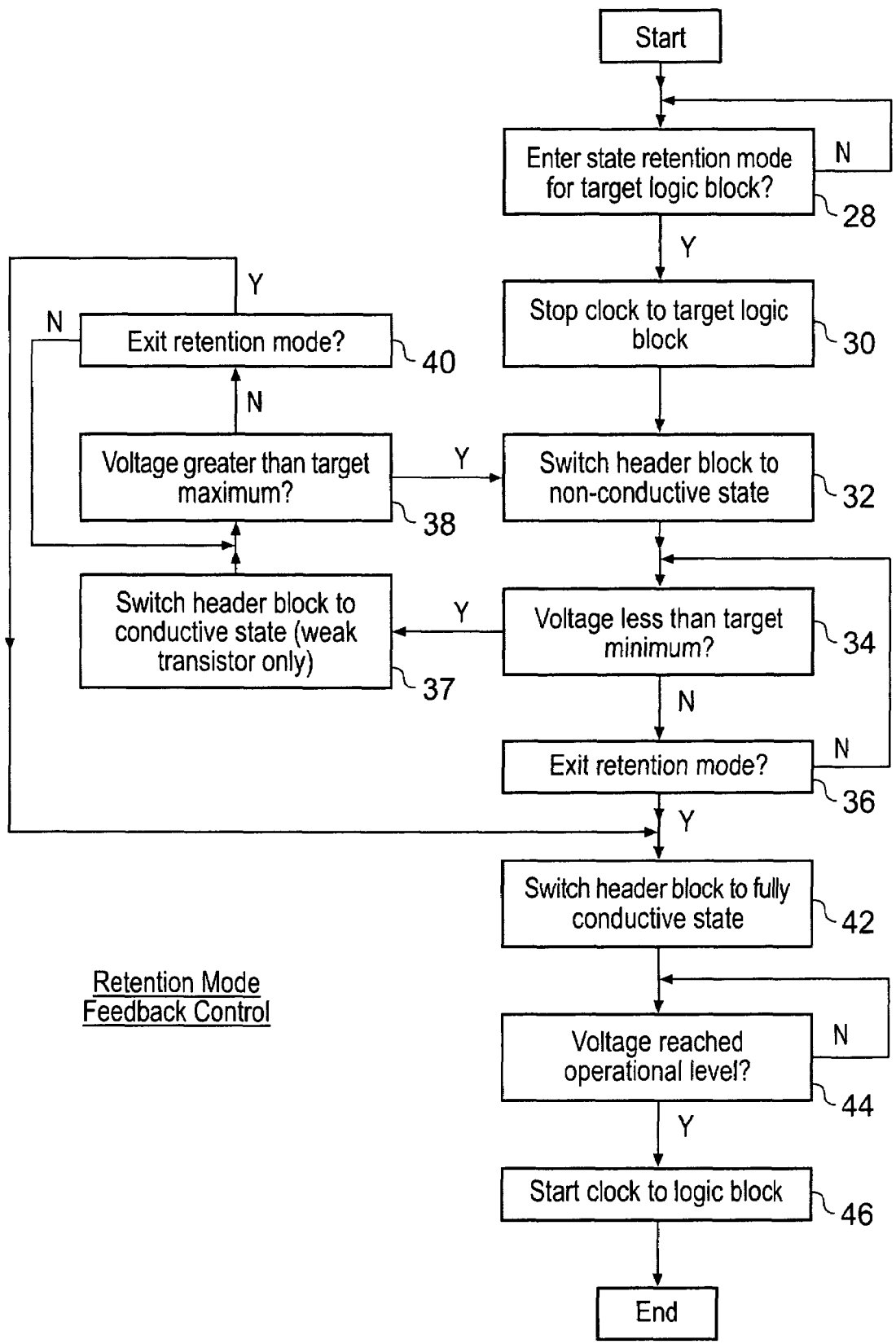
FIG. 5 is a flow diagram schematically illustrating the feedback control which can be used to perform modulation of the connection of a main power rail to a virtual power rail.

FIG. 5 is a flow diagram schematically illustrating the operation of a switch controller 18 in accordance with one example embodiment. It will be appreciated that the flow diagram of FIG. 5 necessarily represents the control as a serial sequence of processing operations. It will be appreciated by those in this technical field that in practice some or all of these operations may be performed in parallel by a circuit implementation. Nevertheless, the flow diagram of FIG. 5 is useful in understanding the operation of the switch controller 18.

At step 28 the switch controller 18 waits until a signal is received indicating that the state retention mode is to be entered (retn). When this signal is received, then processing proceeds to step 30 at which the clock signal clk is stopped and the clock signal levels held static. The static nature of the processing logic of the logic blocks 16 enables these to tolerate such clock stopping and maintain state signal values providing the voltage difference applied across the logic block 16 does not fall below a minimum retention voltage.

At step 32 the header blocks 12 are switched to a non-conductive state. In this example, only header blocks are being employed although it will be appreciated that alternatively footer blocks could be employed or header blocks and footer blocks could be used in combination. When the header blocks have been switched off at step 32, processing proceeds around the loop comprising steps 34 and 36 which respectively check that the voltage level on the virtual supply rail 18 has not fallen too low and that no signal has been received indicating that the retention mode is to be exited (pwr_req). If the voltage level is detected as having fallen to low at step 34, then processing proceeds to step 37 at which the header switch 12 (more specifically the weak transistor 22) is switched into its conductive state. The strong transistor 20 can be maintained in its non-conductive state during such modulation. This causes the virtual supply rail voltage to rise.

Steps 38 and 40 then monitor to see if the virtual supply rail voltage has risen above the target maximum and if a signal to execute the retention mode has been received. If the virtual supply rail voltage does exceed the target maximum, then processing returns to step 32 at which the header block is rendered fully non-conductive (e.g. the weak transistor 22 is switched off again with the strong transistor 20 remaining switched off).

If at either step 36 or step 40 it is noted that a signal to exit retention mode has been received (pur-req), then processing proceeds to step 42 at which the header block is switched back to its fully conductive state (e.g. both the strong transistor 20 and the weak transistor 22 are switched on). Step 44 then monitors until an operational level of the virtual supply rail voltage has been reached sufficient to support active processing by the logic block 16. When this operational level of the virtual supply rail voltage has been reached, then step 46 restarts the clock signal.

The circuits described above can have a variety of forms including CMOS transistors, MTCMOS transistors and silicon on insulator devices that are well suited to low power high density implementations.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
    a switch block coupled to a virtual power rail to couple said virtual power rail to a power supply having a source voltage level;
    a switch controller coupled to said switch block to control conduction through said switch block and thereby selectively to connect said virtual power rail to said power source having said source voltage level; and
    logic circuitry coupled to said virtual power rail to draw power therefrom, wherein said switch controller modulates conduction through said switch block to maintain said virtual power rail at an intermediate voltage level, wherein said logic circuitry statically retains one or more state signal values when said logic circuitry is not active and said intermediate voltage results in greater than a minimum retention voltage across said logic circuitry, and said switch controller modulates conduction through said switch block such that said intermediate voltage results in greater than said minimum retention voltage across said logic circuitry and said one or more state signal values are retained in said logic circuitry with an average leakage current in said logic circuitry less than when said virtual power rail is continuously at said source voltage level.

2. An integrated circuit as claimed in claim 1, comprising a power rail coupled to said power source, said switch block being coupled to said power rail and serving to connect said virtual power rail to said power supply via said power rail.

3. An integrated circuit as claimed in claim 2, wherein said switch block is a header block, said power supply is a supply voltage rail and said virtual power rail is a virtual supply voltage rail.

4. An integrated circuit as claimed in claim 2, wherein said switch block is a footer block, said power rail is a ground voltage rail and said virtual power rail is a virtual ground voltage rail.

5. An integrated circuit as claimed in claim 1, wherein said switch controller performs feedback control to adjust said modulation to maintain said intermediate voltage within a predetermined voltage range.

6. An integrated circuit as claimed in claim 5, wherein said switch controller controls a duty ratio of said modulation to maintain said intermediate voltage in accordance with said feedback control.

7. An integrated circuit as claimed in claim 5, wherein said feedback control of said switch controller has a hysteresis characteristic such that said intermediate voltage follows a periodic variation within said predetermined range.

8. An integrated circuit as claimed in claim 5, wherein said feedback control of said switch controller has a hysteresis characteristic such that:
    said switch block is switched to a conductive state when said intermediate voltage has greater than a predetermined maximum difference from said source voltage level; and
    said switch block is switched to a non-conductive state when said intermediate voltage has less than a predetermined minimum difference from said source voltage level.

9. An integrated circuit as claimed in claim 5, wherein said predetermined range of voltages has end points defined by one or more signals generated within said switch controller.

10. An integrated circuit as claimed in claim 1, wherein said switch block comprises at least one strong transistor having a high conductance when switched to a conductive state and at least one weak transistor having a low conductance when switched to a conductive state.

11. An integrated circuit as claimed in claim 10, wherein said switch controller modulates conduction through said weak transistor to maintain said intermediate voltage while said strong transistor is held in a substantially non-conductive state.

12. An integrated circuit as claimed in claim 1, comprising a plurality of switch blocks each having an associated switch controller.

13. An integrated circuit as claimed in claim 12, wherein a subset of said switch blocks and associated switch controllers serve to maintain said intermediate voltage by said modulation.

14. An integrated circuit as claimed in claim 12, wherein each switch block and switch controller which acts to maintain an intermediate voltage upon said virtual power rail by modulation is self-regulating.

15. An integrated circuit as claimed in claim 14, wherein said integrated circuit is formed of MTCMOS transistors.

16. An integrated circuit as claimed in claim 1, wherein said integrated circuit is formed of CMOS transistors.

17. An integrated circuit as claimed in claim 1, wherein said integrated circuit is formed of silicon on insulator devices.

18. An integrated circuit as claimed in claim 1, wherein said logic circuitry comprises a plurality of logic cells.

19. An integrated circuit as claimed in claim 1, wherein said logic circuitry is a clocked logic circuitry responsive to a clock input signal to perform processing operations and to hold state signal values when said clock input signal is static.

20. An integrated circuit as claimed in claim 1, wherein said integrated circuit is a data processing integrated circuit and said control performed by said switch controller serves to reduce power consumption of said integrated circuit when data processing requirement are reduced.

21. An integrated circuit comprising:
switch means coupled to a virtual power rail for coupling said virtual power rail to a power supply having a source voltage level;
switch controller means, coupled to said switch means, for controlling conduction through said switch means and for selectively connecting said virtual power rail to said power supply having said source voltage level; and
logic means, coupled to said virtual power rail, for drawing power therefrom, wherein said switch controller means modulates conduction through said switch means to maintain said second power rail at an intermediate voltage level, wherein said logic means statically retains one or more state signal values when said logic means is not active and said intermediate voltage results in greater than a minimum retention voltage across said logic means, said switch controller means modulates conduction through said switch block such that said intermediate voltage results in greater than said minimum retention voltage across said logic block and said one or more state signal values are retained in said logic block with an average leakage current in said logic block less than when said second power rail is continuously at said source voltage level.

22. A method of reducing power consumption of an integrated circuit having a power supply switchably connected to a virtual power rail and with a logic block drawing power from said virtual power rail, said method comprising:
modulating said connection between said power supply and said virtual power rail so as to maintain a voltage difference across said logic block at a level less than when said virtual power rail is continuously connected to said power rail, wherein said logic block statically retains one or more state signal values when said logic block is not active and said voltage difference results in greater than a minimum retention voltage across said logic block, and said switch controller modulates said connection such that said voltage difference results in greater than said minimum retention voltage across said logic block and said one or more state signal values are retained in said logic block with an average leakage current in said logic block less than when said virtual power rail is continuously connected to said power rail.

23. A method as claimed in claim 22, wherein said modulation is subject to feedback control to maintain said voltage difference within a predetermined voltage range.

24. A method as claimed in claim 23, wherein said feedback control controls a duty ratio of said modulation.

25. A method as claimed in claim 23, wherein said feedback control has a hysteresis characteristic such that said voltage difference follows a periodic variation within said predetermined range.

26. A method as claimed in claim 23, wherein said feedback control has a hysteresis characteristic such that:
said connection is broken when said voltage difference is greater than a predetermined maximum; and
said connection is made when said voltage difference is less than a predetermined minimum.

27. A method as claimed in claim 23, wherein said predetermined range of voltages has end points defined by one or more signals generated within a switch controller that controls said connection.

28. A method as claimed in claim 22, wherein said connection is by a header block to a supply voltage rail and said virtual power rail is a virtual supply voltage rail.

29. A method as claimed in claim 22, wherein said connection is by a footer block to a ground voltage rail and said virtual power rail is a virtual ground voltage rail.

30. A method as claimed in claim 22, wherein said connection is by a strong transistor have a high conductance when switched to a conductive state and a weak transistor have a low conductance when switched to a conductive state.

31. A method as claimed in claim 30, wherein said modulation modulates conduction through said weak transistor to maintain said voltage difference while said strong transistor is held in a substantially non-conductive state.

32. A method as claimed in claim 22, wherein said integrated circuit comprises a plurality of switch blocks each having an associated switch controller.

33. A method as claimed in claim 32, wherein each switch block and switch controller which acts to maintain said voltage difference by modulation is self-regulating.

34. A method as claimed in claim 22, wherein a subset of said switch blocks and associated switch controllers serve to maintain said voltage difference by said modulation.

35. A method as claimed in claim 22, wherein said integrated circuit is formed of CMOS transistors.

36. A method as claimed in claim 35, wherein said integrated circuit is formed of MTCMOS transistors.

37. A method as claimed in claim 22, wherein said integrated circuit is formed of silicon on insulator devices.

38. A method as claimed in claim 22, wherein said logic block comprises a plurality of logic cells.

39. A method as claimed in claim 22, wherein said logic block is a clocked logic block responsive to a clock input signal to perform processing operations and to hold state signal values when said clock input signal is static.

40. A method as claimed in claim 22, wherein said integrated circuit is a data processing integrated circuit and said method serves to reduce power consumption of said integrated circuit when data processing requirement are reduced.

41. An integrated circuit comprising:
a switch block coupled to a virtual power rail to couple said virtual power rail to a power supply having a source voltage level;
a switch controller coupled to said switch block to control conduction through said switch block and thereby selectively to connect said virtual power rail to said power source having said source voltage level; and
logic circuitry coupled to said virtual power rail to draw power therefrom, wherein said switch controller modulates conduction through said switch block to maintain said virtual power rail at an intermediate voltage level, wherein said switch controller performs feedback control to adjust said modulation to maintain said intermediate voltage within a predetermined voltage range, wherein said switch controller controls a duty ratio of said modulation to maintain said intermediate voltage in accordance with said feedback control.

42. An integrated circuit comprising:
a switch block coupled to a virtual power rail to couple said virtual power rail to a power supply having a source voltage level;
a switch controller coupled to said switch block to control conduction through said switch block and thereby selectively to connect said virtual power rail to said power source having said source voltage level; and logic circuitry coupled to said virtual power rail to draw power therefrom, wherein said switch controller modulates conduction through said switch block to maintain said virtual power rail at an intermediate voltage level, wherein said switch controller performs feedback control to adjust said modulation to maintain said intermediate voltage within a predetermined voltage range, wherein said feedback control of said switch controller has a hysteresis characteristic such that:

said switch block is switched to a conductive state when said intermediate voltage has greater than a predetermined maximum difference from said source voltage level; and said switch block is switched to a non-conductive state when said intermediate voltage has less than a predetermined minimum difference from said source voltage level.

43. An integrated circuit comprising:

a switch block coupled to a virtual power rail to couple said virtual power rail to a power supply having a source voltage level;

a switch controller coupled to said switch block to control conduction through said switch block and thereby selectively to connect said virtual power rail to said power source having said source voltage level; and logic circuitry coupled to said virtual power rail to draw power therefrom, wherein said switch controller modulates conduction through said switch block to maintain said virtual power rail at an intermediate voltage level, wherein said switch controller performs feedback control to adjust said modulation to maintain said intermediate voltage within a predetermined voltage range, wherein said predetermined range of voltages has end points defined by one or more signals generated within said switch controller.

44. A method of reducing power consumption of an integrated circuit having a power supply switchably connected to a virtual power rail and with a logic block drawing power from said virtual power rail, said method comprising:

modulating said connection between said power supply and said virtual power rail so as to maintain a voltage difference across said logic block at a level less than when said virtual power rail is continuously connected to said power rail, wherein said modulation is subject to feedback control to maintain said voltage difference within a predetermined voltage range, wherein said feedback control controls a duty ratio of said modulation.

45. A method of reducing power consumption of an integrated circuit having a power supply switchably connected to a virtual power rail and with a logic block drawing power from said virtual power rail, said method comprising:

modulating said connection between said power supply and said virtual power rail so as to maintain a voltage difference across said logic block at a level less than when said virtual power rail is continuously connected to said power rail, wherein said modulation is subject to feedback control to maintain said voltage difference within a predetermined voltage range, wherein said feedback control has a hysteresis characteristic such that:

said connection is broken when said voltage difference is greater than a predetermined maximum; and said connection is made when said voltage difference is less than a predetermined minimum.

46. A method of reducing power consumption of an integrated circuit having a power supply switchably connected to a virtual power rail and with a logic block drawing power from said virtual power rail, said method comprising:

modulating said connection between said power supply and said virtual power rail so as to maintain a voltage difference across said logic block at a level less than when said virtual power rail is continuously connected to said power rail, wherein said modulation is subject to feedback control to maintain said voltage difference within a predetermined voltage range, wherein said predetermined range of voltages has end points defined by one or more signals generated within a switch controller that controls said connection.

* * * * *